United States Patent
Farquhar et al.

(10) Patent No.: US 10,190,211 B2
(45) Date of Patent: *Jan. 29, 2019

(54) HIGH CONDUCTIVITY GRAPHANE-METAL AND GRAPHENE-METAL COMPOSITE AND METHODS OF MANUFACTURE

(71) Applicant: Fourté International, Sdn. Bhd., Penang (MY)

(72) Inventors: James J. Farquhar, Penang (MY); Choon Ming Seah, Penang (MY)

(73) Assignee: Fourté International, SDN. BHD, Bayan Lepas (MY)

( * ) Notice: Subject to any disclaimer, the term of this patent is extended or adjusted under 35 U.S.C. 154(b) by 101 days.

This patent is subject to a terminal disclaimer.

(21) Appl. No.: 15/017,578

(22) Filed: Feb. 5, 2016

(65) Prior Publication Data
US 2017/0145562 A1    May 25, 2017

Related U.S. Application Data

(63) Continuation-in-part of application No. 14/947,951, filed on Nov. 20, 2015, now Pat. No. 9,945,027.

(51) Int. Cl.
*C23C 16/26*   (2006.01)
*B01L 1/00*   (2006.01)
(Continued)

(52) U.S. Cl.
CPC ............... *C23C 16/26* (2013.01); *B01L 1/00* (2013.01); *C23C 16/045* (2013.01);
(Continued)

(58) Field of Classification Search
CPC ..... C23C 16/26; C23C 16/045; C23C 16/545; B32B 15/20; B32B 2266/045; B32B 5/18
(Continued)

(56) References Cited

U.S. PATENT DOCUMENTS

| 4,957,543 | A | 9/1990 | Babjak et al. |
| 8,785,079 | B1 * | 7/2014 | Gross ...................... H01M 4/74 429/209 |

(Continued)

FOREIGN PATENT DOCUMENTS

| KR | 20150071779 | 6/2015 |
| WO | WO2014118547 | 8/2014 |

(Continued)

OTHER PUBLICATIONS

Cesare, "Physicists Announce Graphene's Latest Cousin: Stanene," Nature, 2015, vol. 524, p. 18.
(Continued)

*Primary Examiner* — Alexander M Weddle
(74) *Attorney, Agent, or Firm* — Keith Kline; The Kline Law Firm PC

(57) ABSTRACT

Embodiments of the present technology include graphane-metal and graphene-metal composites. An example composite comprises a porous metal foam substrate, a graphane or graphene layer deposited to the porous metal foam substrate, a metal layer applied to the graphane or graphene layer, and another graphane or graphene layer deposited to the metal layer; the multilayered porous metal foam substrate being compressed to form a graphane-metal or graphene-metal composite.

18 Claims, 12 Drawing Sheets

(51) Int. Cl.
*C23C 16/04* (2006.01)
*C23C 16/54* (2006.01)
*C23C 16/56* (2006.01)
*B82Y 30/00* (2011.01)

(52) U.S. Cl.
CPC ............ *C23C 16/545* (2013.01); *C23C 16/56* (2013.01); *B82Y 30/00* (2013.01)

(58) Field of Classification Search
USPC .......................................................... 427/355
See application file for complete search history.

(56) References Cited

U.S. PATENT DOCUMENTS

| | | | | |
|---|---|---|---|---|
| 9,945,027 | B2* | 4/2018 | Farquhar | C23C 16/26 |
| 2009/0176082 | A1 | 7/2009 | Kuczynski | |
| 2011/0048625 | A1 | 3/2011 | Caldwell et al. | |
| 2011/0070488 | A1* | 3/2011 | West | H01M 4/04 |
| | | | | 429/209 |
| 2011/0286147 | A1* | 11/2011 | Chen | H01G 11/36 |
| | | | | 361/500 |
| 2012/0028798 | A1 | 2/2012 | Worsley et al. | |
| 2012/0273255 | A1 | 11/2012 | Hemond et al. | |
| 2013/0021718 | A1 | 1/2013 | Yager | |
| 2013/0248229 | A1* | 9/2013 | Martens | H01B 1/02 |
| | | | | 174/255 |
| 2013/0280593 | A1* | 10/2013 | Hashimoto | H01M 2/0287 |
| | | | | 429/163 |
| 2013/0319973 | A1 | 12/2013 | Tour et al. | |
| 2014/0110049 | A1* | 4/2014 | Yuen | C09K 5/14 |
| | | | | 156/280 |
| 2014/0209168 | A1 | 7/2014 | Zhamu et al. | |
| 2016/0019995 | A1* | 1/2016 | Zhamu | H01B 1/04 |
| | | | | 428/219 |

FOREIGN PATENT DOCUMENTS

| | | | | |
|---|---|---|---|---|
| WO | WO2014141071 | | 9/2014 | |
| WO | WO-2014141071 A1 * | | 9/2014 | ............... C25D 3/38 |
| WO | WO2015132764 | | 9/2015 | |

OTHER PUBLICATIONS

Kim, et al., "Strengthening Effect of Single-Atomic-Layer Graphene in Metal-Graphene Nanolayered Composites," Nature Communications, 2013, vol. 4 (2114), pp. 1-7.

Saxena, et al., "Stanene: Atomically Thick Free-Standing Layer of 2D Hexagonal Tin," arXiv:1505.05062 [cond-mat.mtrl-sci], 2015, vol. 6, pp. 5.

Wang, et al., "Three Dimensional Few Layer Graphene and Carbon Nanotube Foam Architectures for High Fidelity Supercapacitors," Nano Engergy, 2013, vol. 2 (2), pp. 294-303.

Written Opinion and Search Report dated Jan. 9, 2017 for PCT Application No. PCT/US2016/060853.

Written Opinion and Search Report dated Mar. 10, 2017 for PCT Application No. PCT/US2016/061265.

* cited by examiner

HIGH CONDUCTIVITY GRAPHANE-METAL AND GRAPHENE-METAL COMPOSITE AND METHODS OF MANUFACTURE

CROSS-REFERENCE TO RELATED APPLICATIONS

This application is a continuation-in-part, and claims the priority benefit, of U.S. patent application Ser. No. 14/947,951 filed on Nov. 20, 2015, entitled "High Conductivity Graphene-Metal Composite and Methods of Manufacture," which is incorporated herein by reference in its entirety for all purposes.

FIELD OF THE PRESENT TECHNOLOGY

The present technology relates generally to manufacturing methods, and more particularly but not by limitation, to methods that produce a graphene-metal composite, a stanene-metal composite, or a graphene-metal composite to provide substantial heat and electrical transfer properties from materials such as graphene, stanene, or graphane deposited on porous metal foam followed by compression to increase heat and electrical transfer properties.

SUMMARY

Embodiments of the present technology include a graphane-metal composite comprising: a porous metal foam substrate and a graphane layer deposited to the porous metal foam substrate, the porous metal foam substrate with graphane being compressed into a graphane-metal composite.

In some embodiments, the graphane-metal composite can be manufactured by depositing graphane onto a porous metal foam substrate and compressing the porous metal foam substrate with graphane to form a graphane-metal composite. In some embodiments, graphane is deposited onto the porous metal foam substrate by chemical vapor deposition.

Other embodiments of the present technology include a graphane-metal composite comprising: a porous metal foam substrate; a graphane layer deposited to the porous metal foam substrate; a metal layer applied to the graphane layer; and another graphane layer deposited to the metal layer, the multilayered porous metal foam substrate being compressed to form a graphane-metal composite.

In some embodiments, the graphane-metal composite can be manufactured by depositing a layer of graphane onto a porous metal foam substrate; applying a layer of metal on top of the layer of graphane; depositing another layer of graphane onto the layer of metal; and compressing the multilayered porous metal foam substrate to form a graphane-metal composite.

DETAILED DESCRIPTION

Figure 1A:
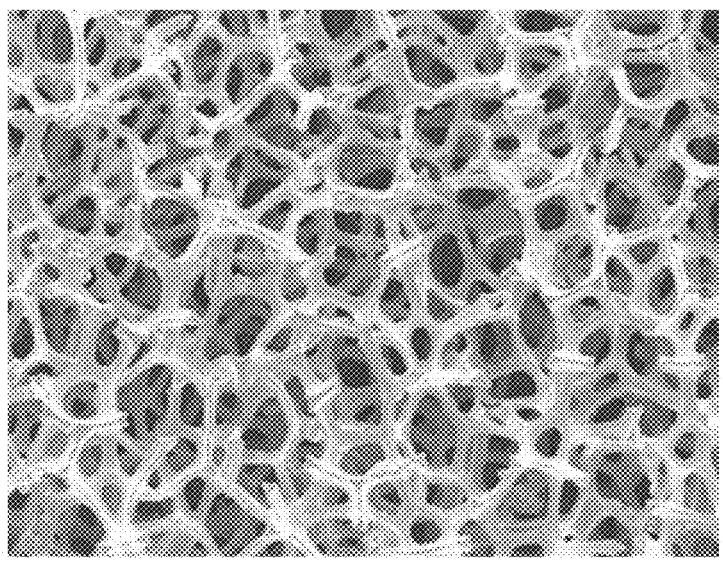
FIG. 1A is a SEM (scanning electron microscope) micrograph of a nickel foam structure.

In the following description, for purposes of explanation and not limitation, specific details are set forth, such as particular embodiments, procedures, techniques, etc. in order to provide a thorough understanding of the present invention. However, it will be apparent to one skilled in the art that the present invention may be practiced in other embodiments that depart from these specific details.

The present disclosure is directed to graphene-metal composites, stanene-metal composites, graphene-metal composites, and methods of manufacture. Graphene is the strongest material, best electrical conductor, and is very light weight. Graphene can be used in various applications such as batteries for electric drive automobiles, filter material for water filters, bendable LCD screens for consumer electronics, nanoelectronics, or light weight body panels for commercial aircrafts. Production techniques for graphene and components and systems integrating graphene are growing rapidly.

Stanene is an ultrathin superconductor. Stanene could be integrated into computer chips at critical junctions to improve speed and energy efficiency. Additionally, graphane could be applied in nanoelectronics as a base for printed circuits with conducting and nonconducting sites.

Since graphene is a two dimensional layer of carbon atoms only one carbon thick and stanene is a two dimensional single layer of tin atoms with the possible addition of fluorine atoms, graphene and stanene have large surface to volume ratios and very little capacity because they are so thin. However, because graphene transmits heat very efficiently, it is desirable to use graphene as a thermal heat sink in order to dissipate heat. When graphene is layered upon another layer of graphene, it forms graphite which is very brittle and less conductive. There is a need to solve the problem of increasing thermal and electrical capacity of graphene. Stanene, comprised of the heavy atom tin, may be a topological insulator and 100% efficient in the transfer of electrons at or above room temperature. Moreover, by adding fluorine atoms to the tin structure, stanene may be super conductive at around the boiling point of water.

Graphane is a two-dimensional, hexagonal hydrogenated form of graphene. The hydrogen atoms are attached at opposites of the carbon atoms plane. In comparison to graphene, graphane retains the thinness, super-strength, flexibility and density of graphene, but the hydrogen-carbon bond of graphane has an insulating effect. It has been found that the heat capacity of graphane is slightly higher than that of graphene. Additionally, the increased flexibility of graphane gives rise to possible high efficiency, high density hydrogen storage. In some instances, graphane and partially hydrogenated graphane structures may be written on graphene in specific areas, for example, using electron-beam lithography.

Graphane is also an insulator and can be bonded onto any layer. It can then be used as a barrier to direct heat in the direction needed. In some embodiments, certain areas of graphane can act as a shield and can tunnel heat into specific pathways. Theoretically, heat can be boxed in on all sides and then directed to a chamber or exhaust area.

In the present technology, graphene is deposited onto a porous metal foam substrate, for example, by chemical vapor deposition. Alternative materials, such as stanene or graphane, may be used in place of graphene throughout the present technology. Any metal foam may be used in the present technology, including, but not limited to, nickel foam and copper foam. In some embodiments, chemical vapor deposition can coat the internal voids and metal bridges within nickel foam with graphene. By compressing the nickel foam deposited with graphene with a compressive force, a graphene-metal composite is created with a flattened graphene matrix for current to travel across. Even before compression, additional layers of graphene can be deposited, but the graphene cannot be deposited directly onto carbon atoms, which would form graphite. Instead a layer of metal, such as copper, nickel, palladium, gold, or any other metal, can be flash coated over graphene or by any other plating mechanism in order for another layer of graphene to be grown on top of the metal followed by compression after a desired number of layers of graphene have been deposited. In some embodiments, the porous metal foam enhanced with graphene, stanene, or graphane can be used in fiber optics to increase thermal, electrical, and shielding properties.

These and other advantages of the present technology will be described with reference to the collective drawings.

Figure 1B:
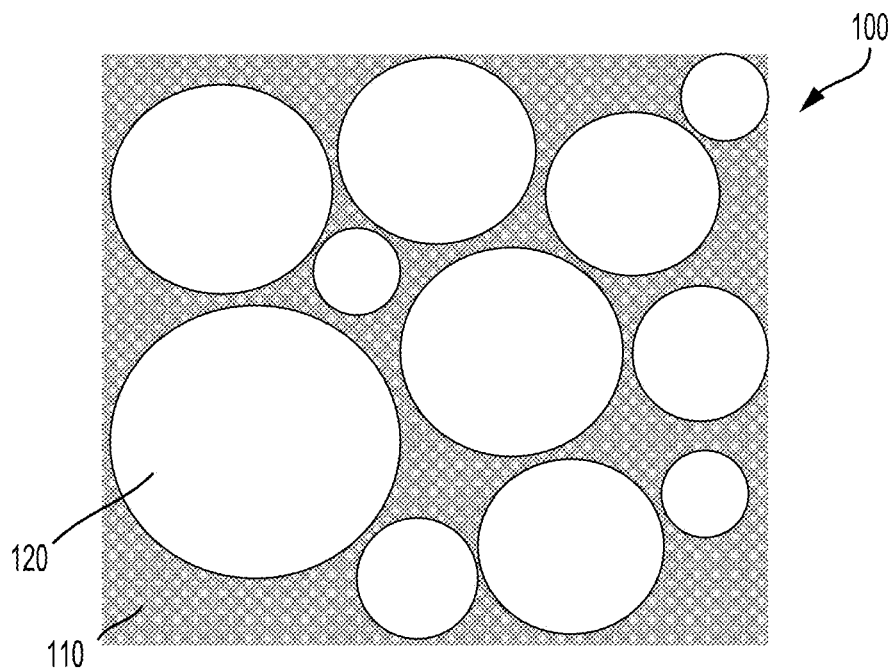
FIG. 1B is a conceptual drawing showing an open-cell metal foam substrate such as nickel foam.

Referring now to FIGS. 1A and 1B, which collectively illustrate an embodiment of nickel foam, FIG. 1A is a SEM micrograph depicting an exemplary microstructure of foamed nickel. FIG. 1B is a conceptual drawing showing an open-cell metal foam substrate. An open-cell metal foam refers to the structure formed by a plurality of cells where inside surfaces of the cells are accessible from neighboring cells in contrast to closed-cell structure where individual cells may be self-contained, for example, in a bubble-like structure. The open-cell metal foam structure 100 of FIG. 1B comprises metal foam 110 formed with void spaces 120. According to exemplary embodiments, open-cell metal foam structure 100 is comprised of nickel. Nickel foam is a low density permeable material with a very high porosity. Nickel foam can be made in a wide porosity range, for example, ranging from 70% to 98% by volume. In some embodiments, the porosity of nickel foam used in the present technology is where at least 95% of the volume consists of void spaces or higher.

In some embodiments, the nickel foam utilized in the present technology can be produced by coating polyurethane foam with nickel metal, for example, by chemical vapor deposition (CVD). The nickel-coated polyurethane foam is heated to remove the polymer substrate, leaving the porous nickel as the finished product. The pore size is determined by the pore size of the polymer template. The CVD process is unique in that it allows a uniform 3-D distribution of nickel on the polymer substrate over a wide range of thicknesses of the nickel. The thickness of the nickel is determined by residence time inside a plating chamber.

Figure 2:
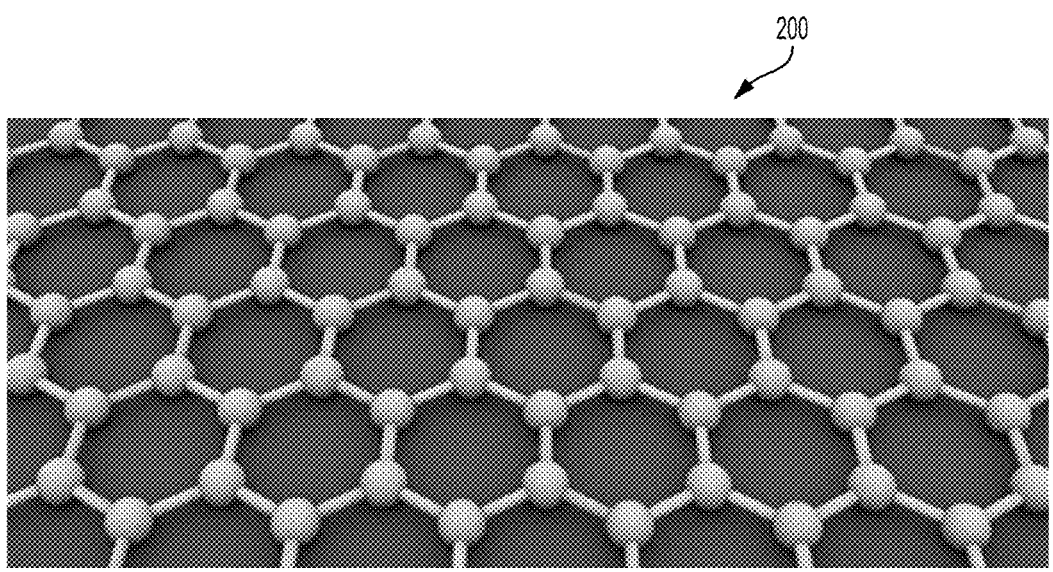
FIG. 2 illustrates the chemical structure of graphene.

FIG. 2 illustrates the chemical structure of graphene. Graphene is a two dimensional sheet of carbon arranged in hexagonal honeycomb lattice that has highly desirable physical properties. Graphene is the strongest material compared to other materials in Table 1, having a Young's modulus of 1000 GPa, yet it is extremely flexible, quite stable, and mechanically resilient. Graphene can also be transferred onto any shaped surface, flat or irregular. Graphene is also the best electrical conductor compared to other materials in Table 1, having a theoretical conductivity of 5020 W/m*K, and graphene transmits heat very efficiently. Graphene, being a single atomic layer thick, has a large surface to volume ratio; however, the thinness of graphene results in very little capacity.

Other carbon allotropes that comprise variations on the lattice structure of graphene are graphite, diamond, and carbon nanotubes. Graphite comprises many layers of graphene stacked on top of each other. While each layer of carbon atoms are tightly bound, only weak bonds known as van der Waals bonds exist between the layers. These weak van der Waals bonds enable the layers to slide laterally, making graphite slippery and brittle. As seen in Table 1, the conductivity of graphene can be almost 3 times higher or more than the conductivity of graphite.

Diamond is the most stable form of pure carbon. There are two ways, in order to achieve its tetrahedral lattice structure, very high pressure and high temperature or chemical vapor deposition, making diamonds difficult to make. Diamond is about 15 times denser than graphene, but graphene has a higher tensile strength with a similar Young's modulus described in Table 1.

Carbon nanotubes are layers of graphene that have been grown into a tube. While carbon nanotubes can have diameters only in nanometers, carbon nanotubes can grow to millimeters in length. Carbon nanotubes are one of the strongest fibers with high conductivity like graphene. Some carbon nanotubes have diameters of 1.3 to 3 nanometers, which are microscopic and much smaller than the smallest voids in nickel foam. Unlike single layers of graphene, carbon nanotubes are able to switch on and off using three times less power than traditional silicon transistors.

TABLE 1

Strength Properties and Thermal Conductivity of Various Materials.

| Material | Conductivity (W/m * k) | Density (g/cm$^3$) | Tensile strength (MPa) | Young Modules (GPa) |
| --- | --- | --- | --- | --- |
| Stainless Steel | 16 | 8.74 | 2000 | 210 |
| Tin | 67 | 7.3 | 15-200 | 47 |
| Nickel | 91 | 8.908 | 140-195 | 170 |
| Aluminum | 210 | 2.71 | 40-50 | 70 |
| Brass (70Cu—30Zn) | 115 | 8.5 | 550 | 97 |
| Copper | 398 | 8.94 | 220 | 130 |
| Gold | 315 | 19.32 | 100 | 79 |

TABLE 1-continued

Strength Properties and Thermal Conductivity of Various Materials.

| Material | Conductivity (W/m * k) | Density (g/cm$^3$) | Tensile strength (MPa) | Young Modules (GPa) |
|---|---|---|---|---|
| Silver | 428 | 10.49 | 170 | 83 |
| Diamond | 2500 | 3.51 | 60000 | 1050 |
| Graphite (pyrolytic, some planes) | 300-1500 | 1.3-1.95 | 6.9 to 100 | 8 to 15 |
| Graphene (theoretical) | 5020 | .215 | 130000 | 1000 |
| Carbon Nanotubes (theoretcal) | 3500 | 0.116 | 11000-63000 | N/A |
| Carbon Fiber | 21-180 | N/A | 1600 for laminates, 4137 for fibers alone | N/A |

Figure 3:
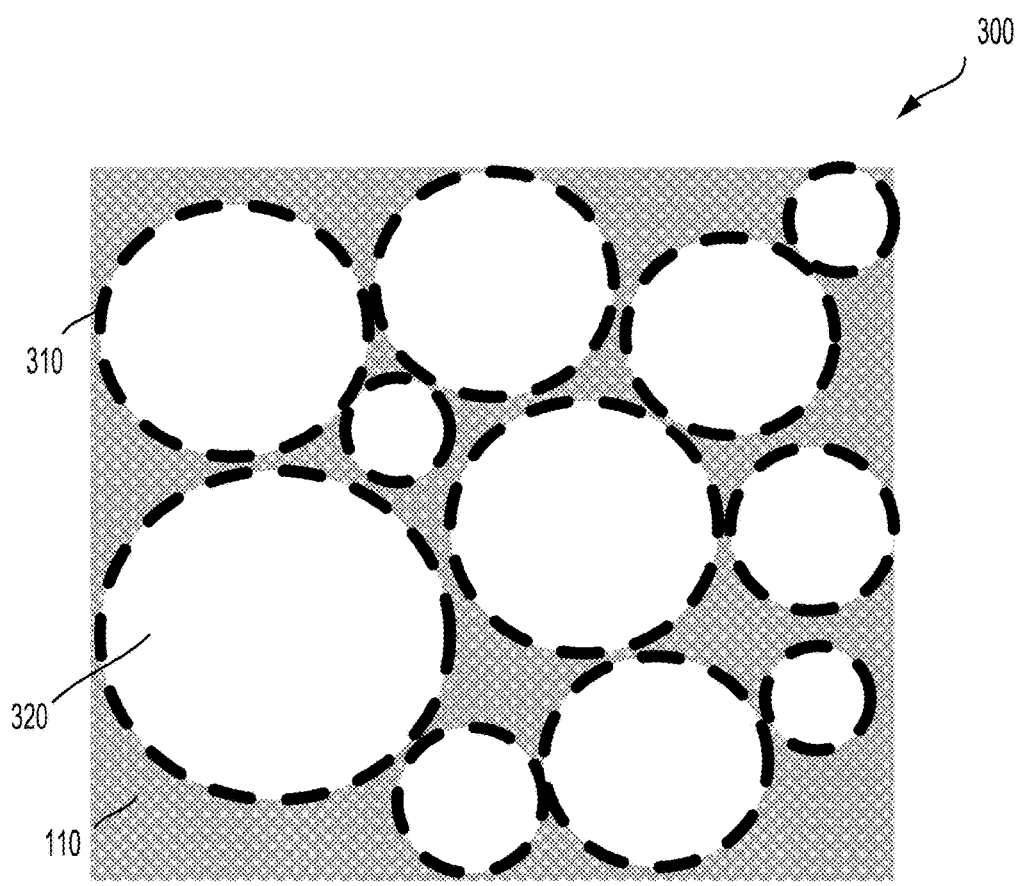
FIG. 3 is a conceptual drawing showing the result of chemical vapor deposition of graphene in an open-cell metal foam substrate to form an example open-cell graphene-metal composite.

FIG. 3 is a conceptual drawing showing chemical vapor deposition of graphene in an open-cell metal foam substrate 110 to form an open-cell graphene-metal foam 300 arranged according to embodiments described herein. Graphene layer 310 may be deposited by a CVD process on metal foam 110 to form a graphene-metal foam 300. For example, graphene layer 310 may be deposited on the inner surfaces of metal foam 110 in metal foam void spaces 120, resulting in graphene-metal foam void spaces 320.

Figure 4:
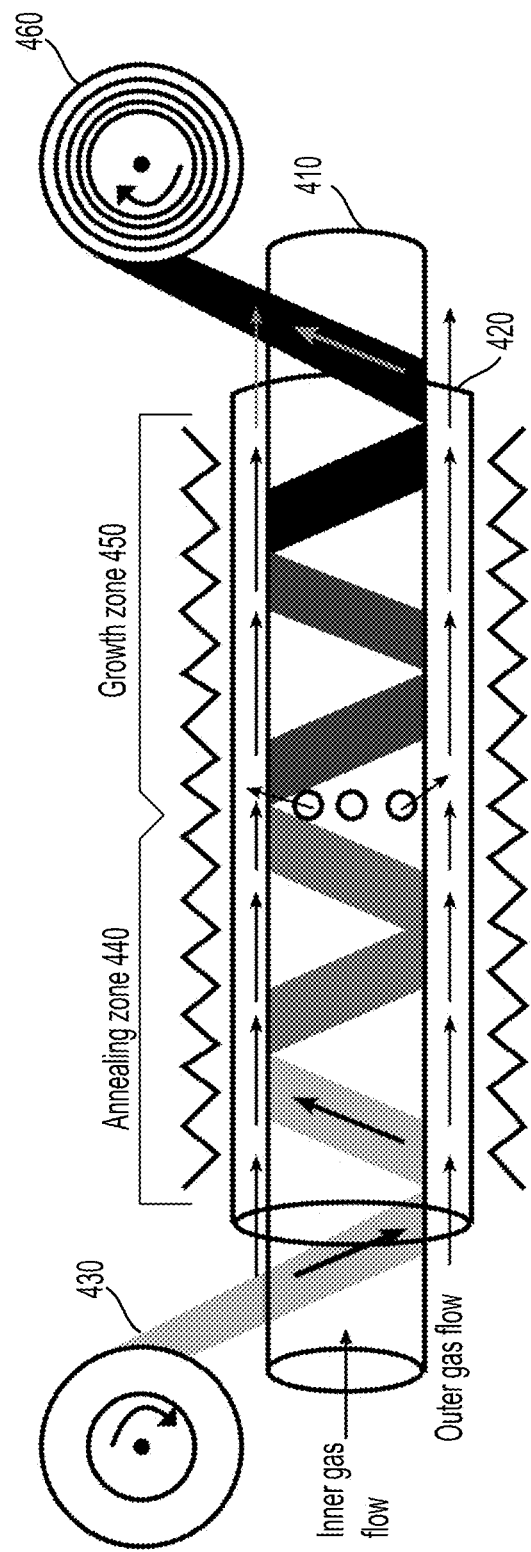
FIG. 4 illustrates an example of a chemical vapor deposition (CVD) manufacturing process.

The CVD process illustrated in FIG. 4 may use any suitable materials and conditions for forming graphene by CVD. For example, in a sealed center chamber comprising an inner tube 410 and an outer tube 420, at least two gases, such as methane ($CH_4$) and hydrogen ($H_2$) can be flowed such that the at least two gasses can meet at a vortex in the center. A roll of a metal foam substrate 430, such as nickel foam, can be sent through the sealed chamber. As the roll of metal foam substrate 430 is heated inside the sealed center chamber at annealing zone 440 and methane gas is flowed through inner tube 410 and hydrogen gas flowed through outer tube 320, the hydrogen catalyzes a reaction between methane and the surface and voids of the roll of metal foam substrate 430, causing carbon atoms from the methane to be deposited onto and within the voids of the metal foam substrate 430. Once a carbon atom occupies a position on the surface of the metal substrate, it pushes other carbons to the side, creating a one atom thick layer of carbon. As the sealed center chamber is quickly cooled at growth stage 450, the deposited carbon layer is crystalized into a continuous graphene layer on metal foam substrate 430, and the deposited carbon layer is kept from aggregating into bulk graphite. In some embodiments, a payout and take up mechanism moves the roll of metal foam substrate 430 through the sealed center changer, resulting in a roll of metal foam substrate deposited with graphene 460.

CVD of graphene on a metal foam substrate provides a much larger surface area to be coated with graphene compared to a single layer of graphene that is deposited on a solid metal film. For example, a 1 inch by 1 inch by 0.003 inch piece of solid nickel film coated by graphene could have two layers of graphene per side, which would be 0.0000000078 inches thick and $46 \times 10^{15}$ atoms per side based on the two layers. Based on the amount of atoms, the graphene weight in grams can be calculated. Similarly, the weight of atoms deposited onto a 1 inch by 1 inch by 0.062 inch thick piece of nickel foam before compression can be calculated based on the porosity of the metal foam.

Figure 5:
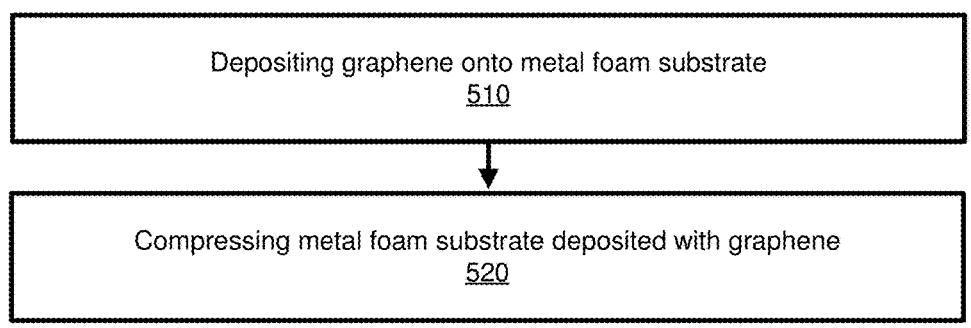
FIG. 5 is a flow diagram illustrating an example method of manufacturing a graphene-metal composite according to exemplary embodiments of the present technology.

FIG. 5 is a flow diagram illustrating an example method of manufacturing a graphene-metal composite according to exemplary embodiments of the present technology. FIG. 5 illustrates a method 500 for manufacturing a graphene-metal composite. At step 510, method 500 begins by depositing graphene onto a porous metal foam substrate. In some embodiments, the porous metal foam substrate is nickel foam where the nickel foam has a high porosity of at least 95% or more. In various embodiments, graphene can be deposited onto the nickel foam by the chemical vaporization deposition process described in FIG. 4.

Various different methods can also be used to produce graphene. According to some embodiment, graphene can be chemically synthesized by using chemicals to purify graphite and heat to reshape and reform the carbon atoms into nano-structured configuration which can be processed into sheets, added onto nickel foam, or processed into carbon nanotubes. Carbon nanotube ropes can be grown throughout the porous structure of a metal foam using a catalyst material and a heated carbon-rich gas flowing over the metal surface. These carbon nanotube ropes would occupy the voids within the metal foam, and when the desired amount of carbon nanotubes is produced, the foam can be compressed, leaving a thermal and electrical super highway through the materials.

In some embodiments, graphene can be produced from graphite using ultrasonic irradiation. Graphite is added in a mixture of dilute organic acid, alcohol, and water, and the mixture is exposed to ultrasonic irradiation. The acid separates the graphene sheets head together by van der Waals bonds, resulting in a large quantity of undamaged, high-quality graphene dispersed into water.

Figure 6:
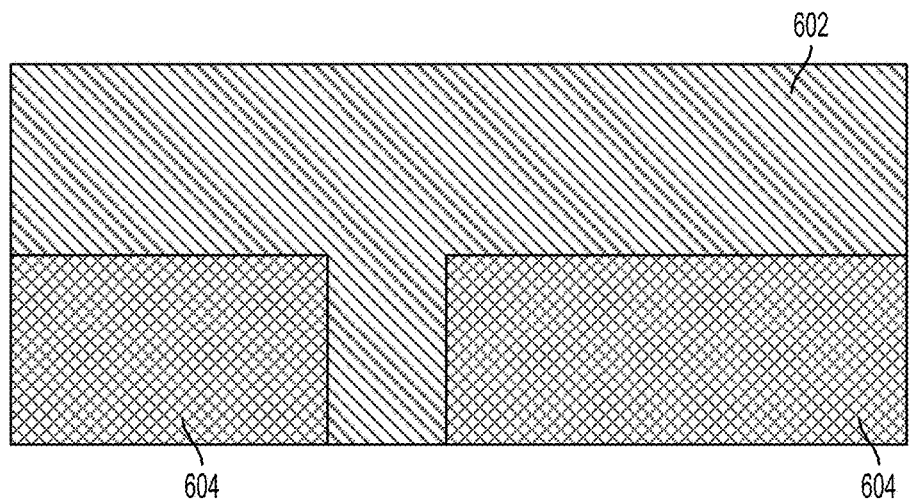
FIG. 6 is a cross sectional view of an embodiment of clad material with enhanced graphene according to exemplary embodiments of the present technology.

In an exemplary embodiment depicted in FIG. 6, graphene-enhanced nickel foam 602 can be roll bonded to the surface of a structural material 604, filling pre-stamped openings to allow for a thermal and electrical conduit to pass through the structural material. This will allow thermal, electrical, and shielding properties to travel in a co-planar direction as well as a trans-planar path, thus adding more capacity to the mass and amplifying the composite's ability to act as a super conduit. By having relief areas in the structural member before roll bonding the structural member to the graphene-enhanced foam, thermal pathways can be created to help dissipate heat through the structural member and out of a device through the metal foam composite. See, e.g., U.S. patent application Ser. No. 14/876,733, filed Oct. 6, 2015, titled "Multiple Layered Alloy/Non Alloy Clad Materials and Methods of Manufacture", the disclosure of which is incorporate herein by reference in its entirety for all purposes. The present application discloses additional embodiments of roll bonded clad material.

Figure 7:
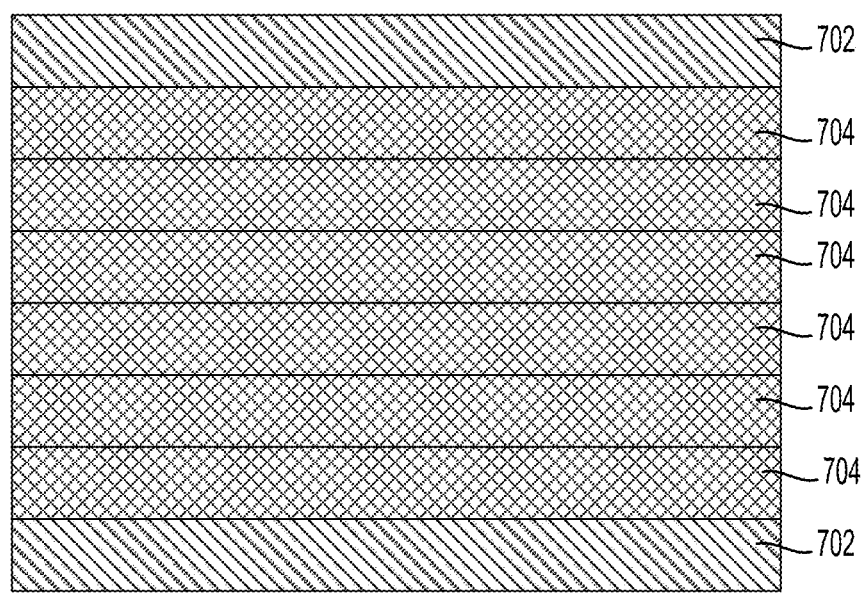
FIG. 7 is a cross sectional view of an embodiment of roll bonded nickel and copper foil enhanced with graphene according to exemplary embodiments of the present technology.

According to some embodiments as depicted in FIG. 7, layers of copper foil 704 coated with graphene can be roll bonded. For example, a 0.003 inch thick roll bonded material may comprise two outers layers of nickel 702 each 0.0004 inch think and six 0.0004 inch layers of copper 704 between the layers of nickel 702. Coating the outside of two layers of nickel foil 702 yields eight layers of graphene and 12 more layers of graphene are added to the six copper layers 704, giving a total of 20 layers of graphene within the 0.03 inch of roll bonded material. In some embodiments, graphene can be grown on thin sheets of nickel, copper, tin, or any other metal. After the growth process, the thin metal sheets are atomically bonded together by a cladding process. The resultant composite has many layers of metal and graphene, adding more capacity to the mass, allowing for greater thermal, electrical, and shielding properties of the composite.

In an alternate embodiment, a predefined material, such as copper, nickel, tin, or any other metal or target material, can be deposited at an atomic level on an intended substrate, such as a layer of graphene, stanene, or graphane, by sputter deposition, a physical vapor deposition method of depositing thin films by sputtering whereby particles are ejected from a target material due to the collision of the target material by high energy particles. In some embodiments, the sputter deposition is performed in a vacuum chamber where air is continuously removed, for example, by a vacuum pump, and argon gas is introduced. As the argon atoms collide with the predefined target material, atoms from the surface of the predefined target material and ejected and collected layer by layer on the substrate opposite the target, resulting for example, in copper sputtered between layers of graphene on the atomic level. In exemplary embodiment, the predefined material is sputtered onto the graphene with minimum damage or degradation into the graphene lattice. After the sputter deposition process, the layers of graphene sputtered with copper can be atomically bonded together by a cladding process. The resultant composite also has many layers of metal and graphene, adding more capacity to the mass, allowing for greater thermal, electrical, and shielding properties of the composite.

In another embodiment, metals, thermal plastics, or conductive elastomers can be 3D printed into the voids of nickel foam. Injection molding, compression molding, and die casting are additional methods of introducing thermal plastics or metals on the surface or into the voids of nickel foam. According to exemplary embodiments, thermal paths can be selectively added to certain areas of the nickel foam, making the selected area conductive, while other particular areas would be selected to be insulated within the nickel foam. After the selective addition of thermal paths, the nickel foam can be compressed.

Figure 8:
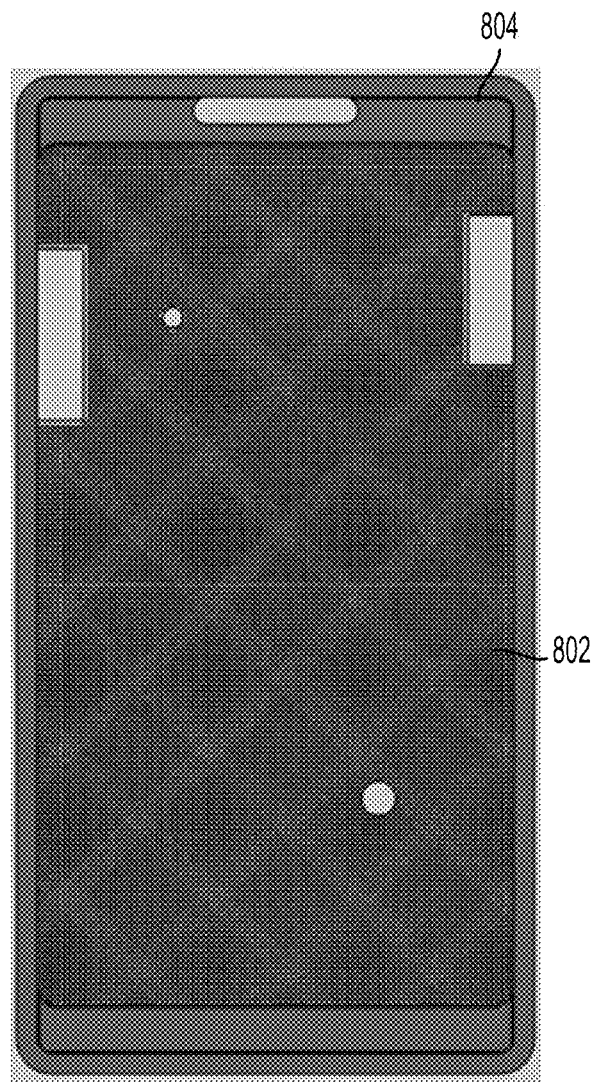
FIG. 8 illustrates die casting enhanced nickel foam into a frame according to exemplary embodiments of the present technology.

In some embodiments, enhanced graphene-nickel foam 802 that may have at least one layer of graphene deposited onto a metal foam substrate can be die casted or injection molded into a frame 804, such as an aluminum mobile phone frame, any aluminum frame, zinc frame, plastic frame, or frame of any material, as depicted in FIG. 8. After die casting nickel foam 802 into an aluminum casing 804, there would be very little stress between the nickel foam 802 and aluminum casing. The nickel foam 802 could then be compressed to a thickness of 0.1 mm to 0.45 mm while keeping the surface of the foam uniform and flat and parallel to the die cast frame 804.

At step 520, the metal foam substrate deposited with graphene is compressed to a desired level of thickness using any desired means of compression. In some embodiments, the metal foam substrate deposited with graphene is compressed substantially closing the voids within the metal foam substrate and making the metal foam substrate with graphene thinner than the thickness of the non-compressed metal foam substrate. For example, nickel foam with thickness of 0.200 inches can be coated with graphene by CVD. Then, the coated nickel foam is rolled or compressed to form a graphene-nickel composite with a thickness of 0.010 inches, twenty times thinner than the thickness of the non-compressed nickel foam. In various embodiments, the amount of compression can be used to control the elastomeric properties of the graphene-metal composite.

The graphene-nickel composite comprises a matrix of graphene inside the nickel foam such that the composite is 40 times more efficient than a single layer of graphene. The properties of the nickel foam are tremendously enhanced by the compression, creating a thermal and electrical conduit. Since graphene is elastic and stretchy, it can be compressed. However, graphene should not be subjected to high heat (over 700° C. in the presence of oxygen) or else it will decompose and convert to carbon dioxide. Also, graphene has been reported to be as brittle as ceramics and can crack. Graphene can even crack while it is manufactured.

Figure 9:
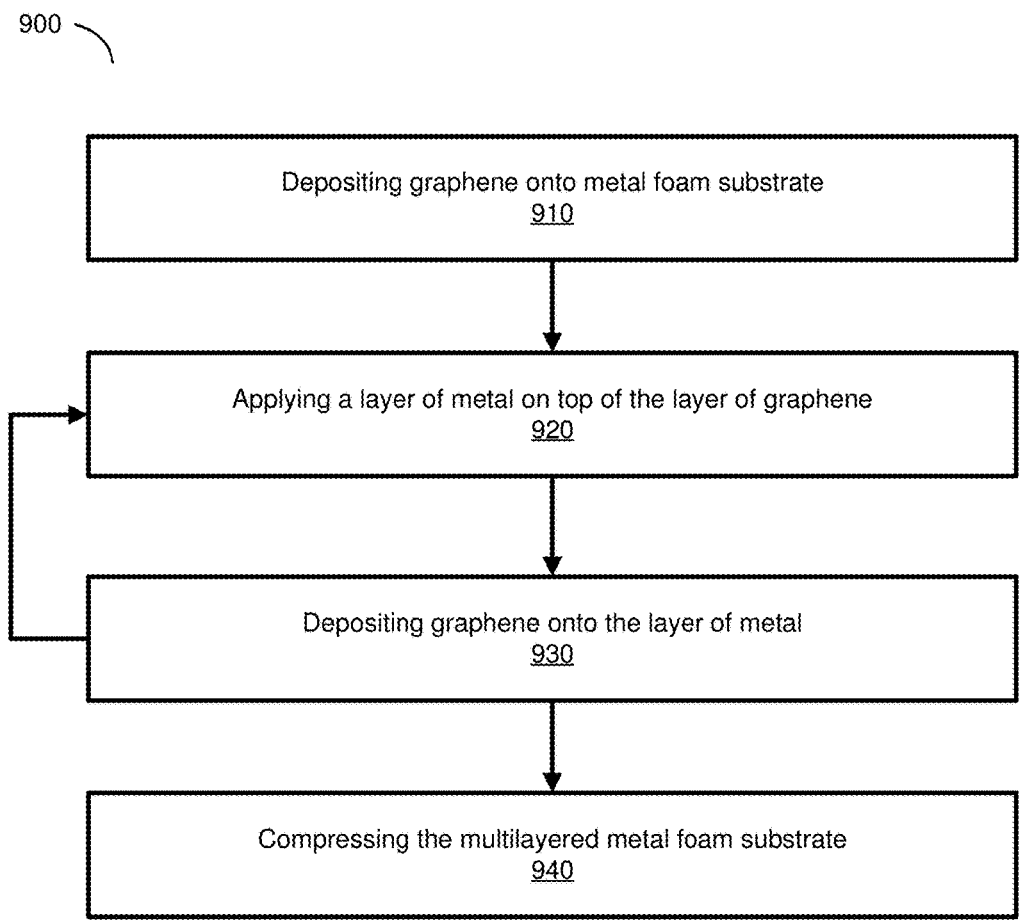
FIG. 9 is a flow diagram illustrating another example method of manufacturing a graphene-metal composite according to exemplary embodiments of the present technology.

FIG. 9 is a flow diagram illustrating another example method of manufacturing a graphene-metal composite according to exemplary embodiments of the present technology. FIG. 9 illustrates a method 900 for manufacturing a graphene-metal composite where the metal foam substrate can be coated with a plurality of layers of graphene. Similar to method 500, method 900 begins at step 910 by depositing graphene onto a porous metal substrate. In some embodiments, the graphene is deposited by chemical vapor deposition, the graphene is chemically synthesized, or any other method of synthesizing and depositing graphene.

At step 920, a layer of metal is applied to the metal foam substrate deposited with graphene. In some embodiments, the metal is flash coated or plated over the graphene. In order for graphene to be layered on the metal foam substrate, a metal layer needs to be applied between graphene layers because as previously discussed direct layers of graphene will create graphite, which is brittle and has less desirable thermal properties than graphene. By adding multiple layers graphene and metal to a metal foam substrate, the thermal and electrical properties of the graphene-metal composite could be increased exponentially. Additionally, in various embodiments, the metal that is applied between the layer of graphene can be any metal, including, but not limited to copper, nickel, palladium or gold. Furthermore, any substrate upon which graphene can be grown can be used in the present technology, such as glass and ceramic, although their conductivity is low. Nickel has better properties for growing graphene allowing two layers of graphene per side to be grown in a single process. It is also very malleable, has good corrosion quality, but it is not very strong and its conductivity is about four times lower than copper. Copper is soft, malleable, and has great thermal characteristics.

At step 930, graphene is deposited onto the layer of metal using chemical vapor deposition, the graphene is chemically synthesized, or any other method of synthesizing and depositing graphene. Then steps 920 and 930 can be repeated to deposit a desired number of layers of graphene. For example, steps 920 and 930 can be repeated 6, 7, or 8 times. Once the desired number of layers of graphene is deposited, the multilayered metal foam substrate is then compressed or rolled at step 940 to a desired level of thickness, resulting in a graphene-metal composite.

Figure 10:
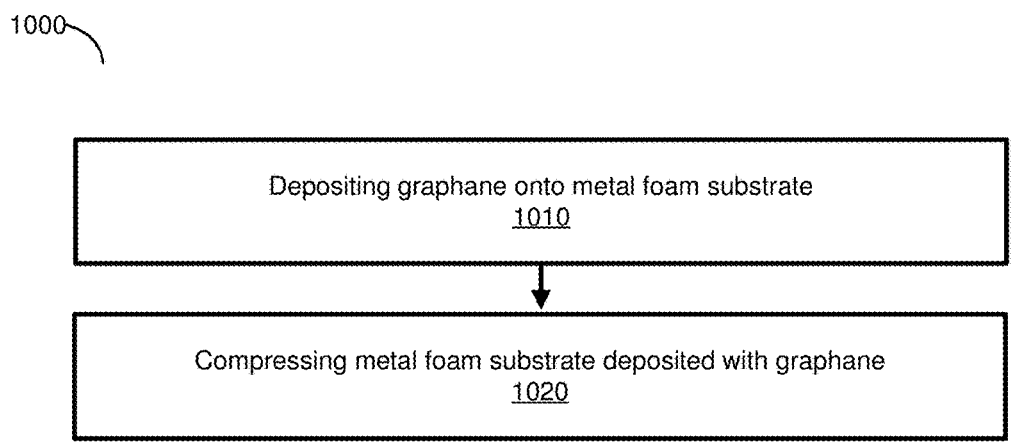
FIG. 10 is a flow diagram illustrating an example method of manufacturing a graphane-metal composite according to exemplary embodiments of the present technology.

FIG. 10 is a flow diagram illustrating an example method of manufacturing a graphane-metal composite according to exemplary embodiments of the present technology. FIG. 10 illustrates a method 1000 for manufacturing a graphane-metal composite. At step 1010, method 1000 begins by depositing graphane onto a porous metal foam substrate. In some embodiments, the graphane is deposited by chemical vapor deposition, the graphane is chemically synthesized, or any other method of synthesizing and depositing graphane. At step 1020, the metal foam substrate deposited with graphane is compressed to a desired level of thickness using any desired means of compression.

Figure 11:
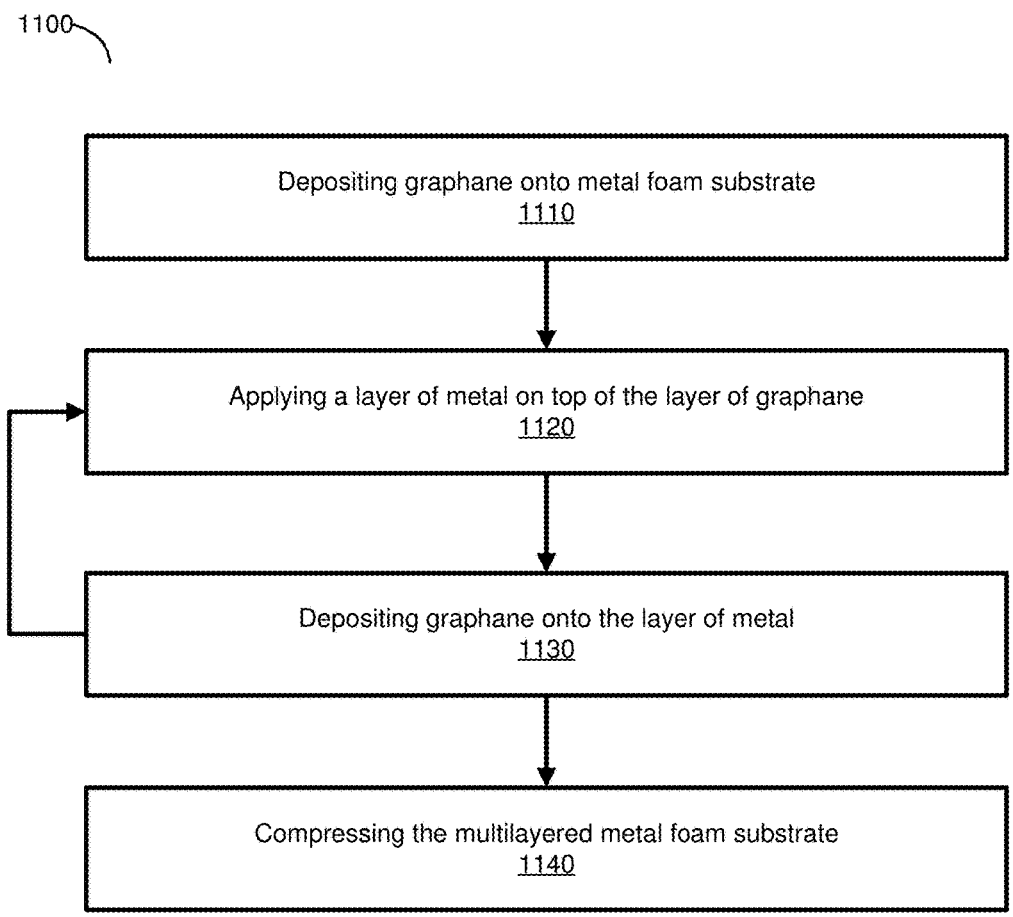
FIG. 11 is a flow diagram illustrating another example method of manufacturing a graphene-metal composite according to exemplary embodiments of the present technology.

FIG. 11 is a flow diagram illustrating another example method of manufacturing a graphane-metal composite according to exemplary embodiments of the present technology. FIG. 11 illustrates a method 1100 for manufacturing a graphane-metal composite where the metal foam substrate can be coated with a plurality of layers of graphane. Similar to method 1000, method 1100 begins at step 1110 by depositing graphane onto a porous metal substrate. In some embodiments, the graphane is deposited by chemical vapor deposition, the graphane is chemically synthesized, or any other method of synthesizing and depositing graphane.

At step 1120, a layer of metal is applied to the metal foam substrate deposited with graphane. In some embodiments, the metal is flash coated or plated over the graphane. In order for graphane to be layered on the metal foam substrate, a metal layer needs to be applied between graphane layers because as previously discussed direct layers of graphane will create graphite, which is brittle and has less desirable thermal properties than graphane. By adding multiple layers graphane and metal to a metal foam substrate, the thermal and electrical properties of the graphane-metal composite could be increased exponentially. Additionally, in various embodiments, the metal that is applied between the layer of graphane can be any metal, including, but not limited to copper, nickel, palladium or gold. Furthermore, any substrate upon which graphane can be grown can be used in the present technology, such as glass and ceramic, although their conductivity is low. Nickel has better properties for growing graphane allowing two layers of graphane per side to be grown in a single process. It is also very malleable, has good corrosion quality, but it is not very strong and its conductivity is about four times lower than copper. Copper is soft, malleable, and has great thermal characteristics.

At step 1130, graphane is deposited onto the layer of metal using chemical vapor deposition, the graphane is chemically synthesized, or any other method of synthesizing and depositing graphane. Then steps 1120 and 1130 can be repeated to deposit a desired number of layers of graphane. For example, steps 1120 and 1130 can be repeated 6, 7, or 8 times. Once the desired number of layers of graphane is deposited, the multilayered metal foam substrate is then compressed or rolled at step 1140 to a desired level of thickness, resulting in a graphane-metal composite.

Figure 12:
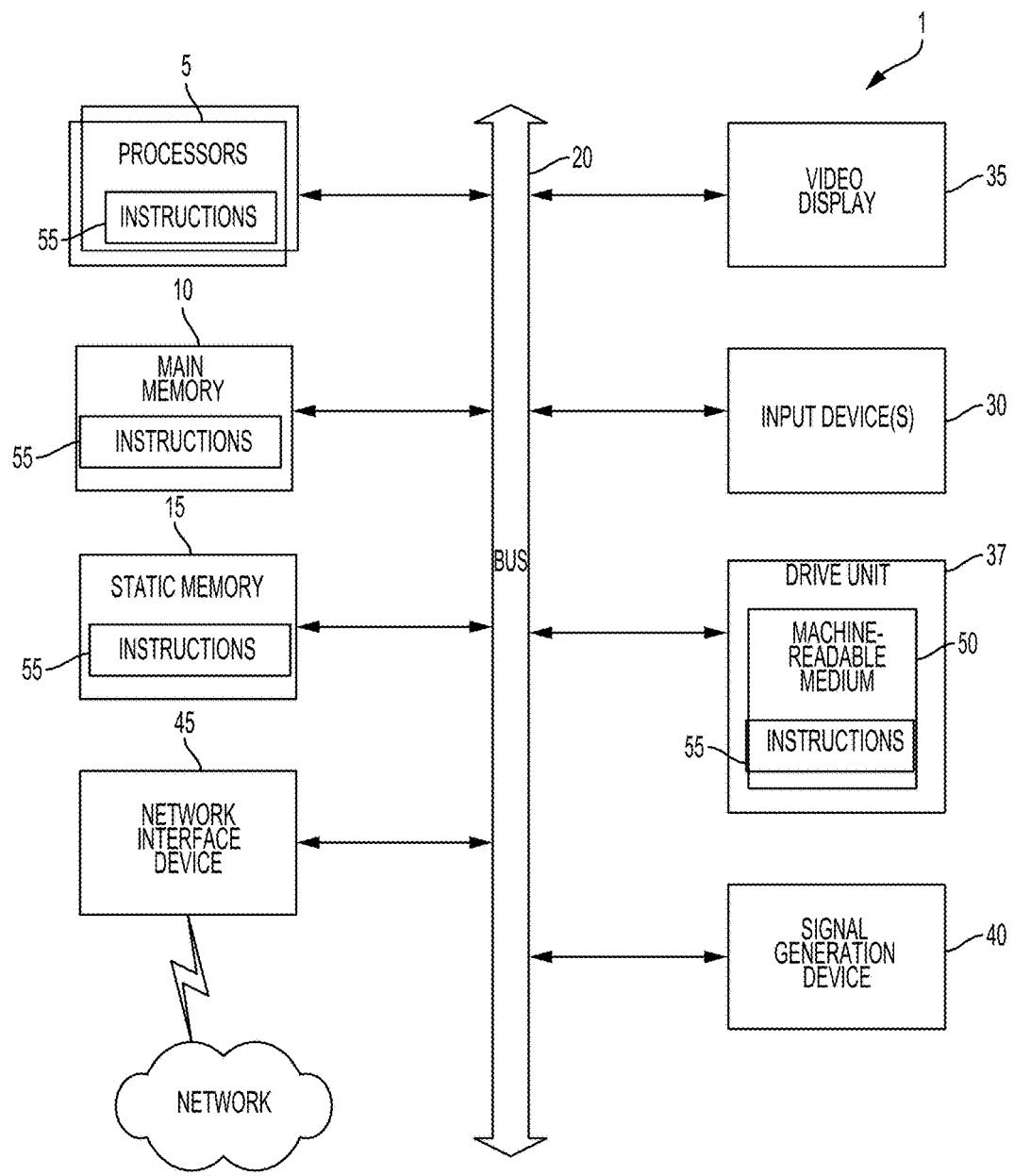
FIG. 12 is a schematic diagram of an example computer system that can be utilized to implement aspects of the present technology.

FIG. 12 illustrates an example computer system 1 that can be utilized to control the chemical vapor deposition machine and compression machine. That is, the computer system 1 can select thermal profiles to control the heating and cooling during graphane deposition.

The computer system 1, within which a set of instructions for causing the machine to perform any one or more of the methodologies discussed herein may be executed. In various example embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a robotic construction marking device, a base station, a personal computer (PC), a tablet PC, a set-top box (STB), a personal digital assistant (PDA), a cellular telephone, a portable music player (e.g., a portable hard drive audio device such as an Moving Picture Experts Group Audio Layer 3 (MP3) player), a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1 includes a processor or multiple processors 5 (e.g., a central processing unit (CPU), a graphics processing unit (GPU), or both), and a main memory 10 and static memory 15, which communicate with each other via a bus 20. The computer system 1 may further include a video display 35 (e.g., a liquid crystal display (LCD)). The computer system 1 may also include an alpha-numeric input device(s) 30 (e.g., a keyboard), a cursor control device (e.g., a mouse), a voice recognition or biometric verification unit (not shown), a drive unit 37 (also referred to as disk drive unit), a signal generation device 40 (e.g., a speaker), and a network interface device 45. The computer system 1 may further include a data encryption module (not shown) to encrypt data.

The drive unit 37 includes a computer or machine-readable medium 50 on which is stored one or more sets of instructions and data structures (e.g., instructions 55) embodying or utilizing any one or more of the methodologies or functions described herein. The instructions 55 may also reside, completely or at least partially, within the main memory 10 and/or within the processors 5 during execution thereof by the computer system 1. The main memory 10 and the processors 5 may also constitute machine-readable media.

The instructions 55 may further be transmitted or received over a network via the network interface device 45 utilizing any one of a number of well-known transfer protocols (e.g., Hyper Text Transfer Protocol (HTTP)). While the machine-readable medium 50 is shown in an example embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like. The example embodiments described herein may be implemented in an operating environment comprising software installed on a computer, in hardware, or in a combination of software and hardware.

Not all components of the computer system 1 are required and thus portions of the computer system 1 can be removed if not needed, such as Input/Output (I/O) devices (e.g., input device(s) 30). One skilled in the art will recognize that the Internet service may be configured to provide Internet access to one or more computing devices that are coupled to the Internet service, and that the computing devices may include one or more processors, buses, memory devices, display devices, input/output devices, and the like. Furthermore, those skilled in the art may appreciate that the Internet service may be coupled to one or more databases, repositories, servers, and the like, which may be utilized in order to implement any of the embodiments of the disclosure as described herein.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form. Similarly, a hyphenated term (e.g., "on-demand") may be occasionally interchangeably used with its non-hyphenated version (e.g., "on demand"), a capitalized entry (e.g., "Software") may be interchangeably used with its non-capitalized version (e.g., "software"), a plural term may be indicated with or without an apostrophe (e.g., PE's or PEs), and an italicized term (e.g., "N+1") may be interchangeably used with its non-italicized version (e.g., "N+1"). Such occasional interchangeable uses shall not be considered inconsistent with each other.

Also, some embodiments may be described in terms of "means for" performing a task or set of tasks. It will be understood that a "means for" may be expressed herein in terms of a structure, such as a processor, a memory, an I/O device such as a camera, or combinations thereof. Alternatively, the "means for" may include an algorithm that is descriptive of a function or method step, while in yet other embodiments the "means for" is expressed in terms of a mathematical formula, prose, or as a flow chart or signal diagram.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While specific embodiments of, and examples for, the system are described above for illustrative purposes, various equivalent modifications are possible within the scope of the system, as those skilled in the relevant art will recognize. For example, while processes or steps are presented in a given order, alternative embodiments may perform routines having steps in a different order, and some processes or steps may be deleted, moved, added, subdivided, combined, and/or modified to provide alternative or sub-combinations. Each of these processes or steps may be implemented in a variety of different ways. Also, while processes or steps are at times shown as being performed in series, these processes or steps may instead be performed in parallel, or may be performed at different times.

While various embodiments have been described above, it should be understood that they have been presented by way of example only, and not limitation. The descriptions are not intended to limit the scope of the invention to the particular forms set forth herein. To the contrary, the present descriptions are intended to cover such alternatives, modifications, and equivalents as may be included within the spirit and scope of the invention as defined by the appended claims and otherwise appreciated by one of ordinary skill in the art. Thus, the breadth and scope of a preferred embodiment should not be limited by any of the above-described exemplary embodiments.

What is claimed is:

1. A method for manufacturing a graphene-metal composite comprising:
    depositing graphene onto a porous metal foam substrate;
    3D printing thermal elastomers or metal into voids in the porous metal foam substrate surface;
    growing carbon nanotube ropes throughout the porous metal foam substrate using a catalyst material and a heated carbon-rich gas flowing over the porous metal foam substrate, wherein the carbon nanotube ropes occupy voids within the porous metal foam substrate; and
    compressing the porous metal foam substrate with graphene applied to form a graphene-metal composite, the carbon nanotube ropes leaving a thermal and electrical pathway through the porous metal foam substrate after the compressing.

2. The method according to claim 1, wherein the porous metal foam substrate is nickel or copper foam.

3. The method according to claim 1, wherein the porosity of the porous metal foam substrate is at least 70%.

4. The method according to claim 1, wherein the depositing graphene to a porous metal foam substrate is by chemical vapor deposition.

5. The method according to claim 1, wherein the depositing graphene to a porous metal foam substrate is by growing carbon nanotubes on the surface of the porous metal foam substrate before compressing the porous metal foam substrate.

6. The method according to claim 1, wherein the porous metal foam substrate with graphene applied is compressed to substantially close the voids in the porous metal foam substrate and make the compressed porous metal foam substrate with graphene applied thinner than the thickness of the non-compressed porous metal foam substrate.

7. The method according to claim 1, further comprising die casting or injection molding the graphene-metal composite into an aluminum, zinc, or plastic frame.

8. The method according to claim 1, further comprising roll bonding the graphene-metal composite into a structural member.

9. The method according to claim 1, further comprising roll bonding at least one layer of graphene-metal composite to at least one layer of copper foil coated with graphene.

10. A method for manufacturing a graphene-metal composite comprising:
    depositing a layer of graphene onto a porous metal foam substrate;
    applying a layer of metal on top of the layer of graphene;
    depositing another layer of graphene onto the layer of metal;
    compressing the multilayered porous metal foam substrate to form a graphene-metal composite;
    growing carbon nanotube ropes throughout the porous metal foam substrate using a catalyst material and a heated carbon-rich gas flowing over the porous metal foam substrate, wherein the carbon nanotube ropes occupy voids within the porous metal foam substrate; and
    compressing the porous metal foam substrate with graphene applied to form a graphene-metal composite, the carbon nanotube ropes leaving a thermal and electrical pathway through the porous metal foam substrate after the compressing.

11. The method according to claim 10, wherein the applying a layer of metal on top of the layer of graphene and depositing another layer of graphene onto the layer of metal is repeated until a desired number of layers are made before compressing the multi-layered porous metal foam substrate.

12. The method according to claim 10, wherein the layer of metal is applied to the layer of graphene by flash coating.

13. The method according to claim 10, wherein the metal applied to the layer of graphene is either nickel or copper.

14. The method according to claim 10, wherein the metal applied to the layer of graphene is palladium.

15. The method according to claim 10, wherein the metal applied to the layer of graphene is gold.

16. The method according to claim 10, wherein the porous metal foam substrate is nickel or copper foam.

17. The method according to claim 10, wherein the porosity of the porous metal foam substrate is at least 70%.

18. The method according to claim 10, wherein depositing graphene layers is by chemical vapor deposition.

\* \* \* \* \*